United States Patent
Ng et al.

(10) Patent No.: US 9,887,338 B2
(45) Date of Patent: Feb. 6, 2018

(54) LIGHT EMITTING DIODE DEVICE

(75) Inventors: Kee Yean Ng, Penang (MY); Siang Ling Oon, Penang (MY); Chin Nyap Tan, Penang (MY)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 1148 days.

(21) Appl. No.: 12/510,821

(22) Filed: Jul. 28, 2009

(65) Prior Publication Data

US 2011/0024785 A1 Feb. 3, 2011

(51) Int. Cl.
  *H01L 33/64* (2010.01)

(52) U.S. Cl.
  CPC .. *H01L 33/642* (2013.01); *H01L 2224/48091* (2013.01)

(58) Field of Classification Search
  CPC ............. H01L 33/642; H01L 2224/48091
  USPC .................................... 257/E33.075
  See application file for complete search history.

(56) References Cited

U.S. PATENT DOCUMENTS

| 6,114,413 | A | 9/2000 | Kang et al. | |
| 6,190,941 | B1 * | 2/2001 | Heinz et al. | 438/106 |
| 6,226,183 | B1 * | 5/2001 | Weber et al. | 361/704 |
| 7,274,091 | B2 * | 9/2007 | Yamamura et al. | 257/676 |
| 2005/0045904 | A1 | 3/2005 | Chen et al. | |
| 2005/0139846 | A1 | 6/2005 | Park et al. | |
| 2007/0290328 | A1 * | 12/2007 | Lin | 257/701 |
| 2008/0291631 | A1 | 11/2008 | Hellinger et al. | |
| 2008/0303157 | A1 * | 12/2008 | Cheng et al. | 257/758 |

FOREIGN PATENT DOCUMENTS

| EP | 1816685 A1 | 8/2007 |
| WO | WO 2009/028812 A2 | 3/2009 |

* cited by examiner

*Primary Examiner* — William F Kraig
*Assistant Examiner* — Sun M King
(74) *Attorney, Agent, or Firm* — Sughrue Mion, PLLC

(57) ABSTRACT

An electronic assembly includes a Light Emitting Diode (LED) and a substrate. The LED has a solderable surface other than the contacts. The substrate has an opening. The solderable surface is mounted substantially over the opening. When the opening is filled with solder, the solderable surface is metallically bonded with the solder in the opening.

4 Claims, 3 Drawing Sheets

LIGHT EMITTING DIODE DEVICE

DESCRIPTION OF THE RELATED ART

Light emitting diodes (LED's) are semiconductor devices that emit light when they are forward biased and current is flowing. There is an ongoing demand for increasing light intensity, resulting in higher currents, and more heat. Heat is detrimental to the performance of a LED because light output generally drops with increasing temperature. In addition, the life of a LED device may be shortened by high temperatures. Therefore, heat removal is extremely important in systems using LED's.

Semiconductor LED devices are typically mounted on a substrate that is part of a package, and the package is attached to a circuit board (for example, by soldering). There are various ways of transferring heat from the LED device to an intermediate heat conducting structure, and then to other structures on the circuit board (for example, a metal core or heat sink). Typically, there are multiple thermal interfaces, comprising multiple layers of dissimilar materials, which impede heat flow.

Sometimes, a LED package includes a heat slug (a mass of metal, typically copper) and heat generated by the LED is dissipated by the heat slug, or transferred through the heat slug. The LED is typically attached to the heat slug using an epoxy or a mixture of metals having a low melting point (eutectic) such as gold-tin or tin-copper. In order to attach the LED to the heat slug, proper metallic configurations are needed at each of the mating surfaces. For example, the LED may have metal layers having gold-tin and nickel, and the copper heat slug may have metal layers comprising nickel and gold. In addition, if the heat slug is soldered to a circuit board (for example, a metal-core printed circuit board), then the circuit board also needs compatible metal plating, for example, copper, nickel, and silver/gold. All these various plating layers with dissimilar materials impede heat flow and add manufacturing cost.

FIG. 1 illustrates another prior art example of a LED package mounted on a circuit board. In FIG. 1, an LED package 100 is mounted on a circuit board 102. A package typically also includes a reflector and housing, which are not illustrated. A LED 104 has two electrodes 106. The LED 104 is attached to an intermediate package substrate 108. Each electrode 106 is over an opening 110 in the intermediate package substrate 108. Each opening 110 is filled with a heat conducting material (for example, a metal paste containing a polymer for curing). The openings 110 connect to a metal layer 112 in the intermediate package substrate 108, which in turn connects to contacts 114. The package 100 is attached (for example, soldered) to the circuit board 102, which may contain other circuit elements 116. The filled openings 110, metal layer 112, and contacts 111 all provide electrical connection for LED electrodes 106, as well as heat transfer from LED 104. Note that heat, generated from the light producing layer of the LED 104, must flow through various semiconductor layers to the electrodes 106, through the electrodes 106 (with various plating layers), the heat-conducting-paste filled openings 110, metal layer 112, and contacts 114, and possibly other structures such as a heat sink (not illustrated) on or in the circuit board.

FIG. 2 illustrates another prior art example of a LED package mounted on a circuit board. In FIG. 2, a LED package 200 is mounted on a circuit board 202. An LED 204 has a first electrode 206 on a bottom surface, and a second electrode 208 on a top surface. LED 204 is attached to an intermediate package substrate 210. Electrode 206 is connected (for example, soldered) to a contact 212 on the intermediate package substrate 210, and electrode 208 is wire bonded to a contact 214 on the intermediate package substrate 210. Electrode 206 also interfaces with a via 216 in the intermediate package substrate 210. Via 216 may be filled with a heat-conducting material (for example, metal paste or solder). The LED package 200 is connected (for example, soldered) to circuit board 202, which may contain other circuit elements 218. The circuit board 202 may also contain other structures (not illustrated) for heat sinking. The heat from the light-producing layer of the LED 204 must then pass through various semiconductor layers to the electrode 206, through plating layers on the electrode 206, through the solder in the via 216, and through a thermal interface between the solder-filled via 216 and the circuit board 202.

There is a need for a LED device, mounted on a circuit board or other substrate, with a reduced number of thermal interfaces layers of dissimilar materials), and with improved heat flow, and reduced manufacturing cost.

DETAILED DESCRIPTION

Figure 1:
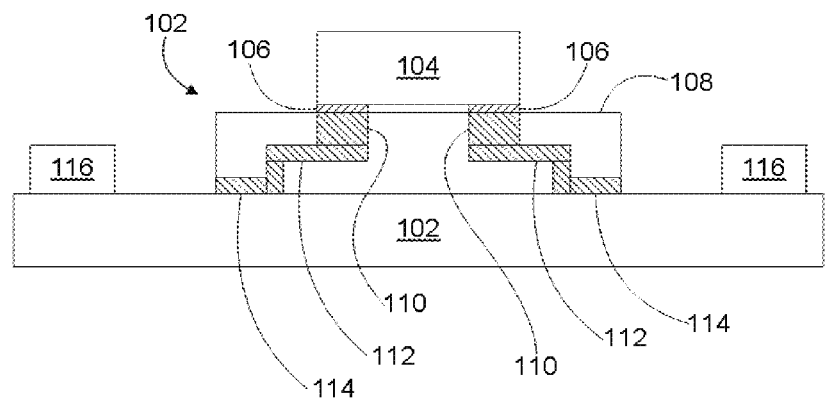
FIG. 1 is a block diagram illustrating an example prior art LED package mounted on a circuit board.
Figure 2:
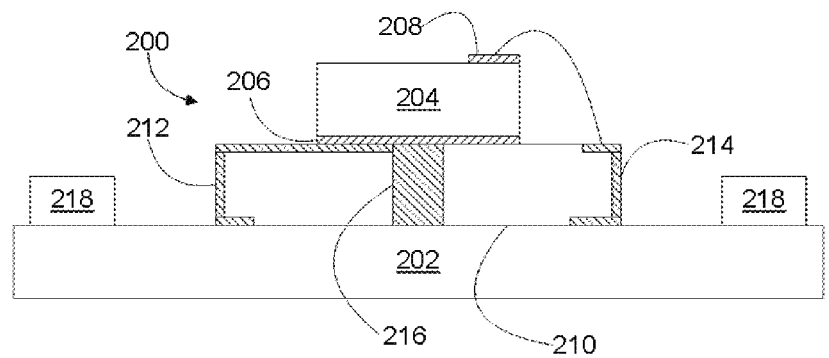
FIG. 2 is a block diagram illustrating another example prior art LED package mounted on a circuit board.
Figure 3:
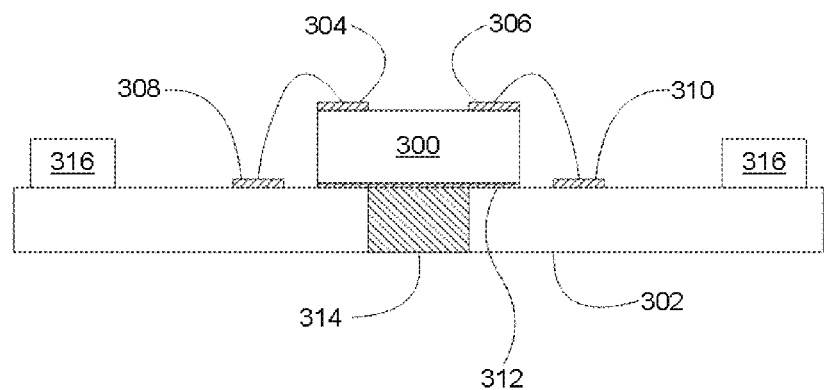
FIG. 3 is a block diagram of an example embodiment of an LED device.
Figure 5A:
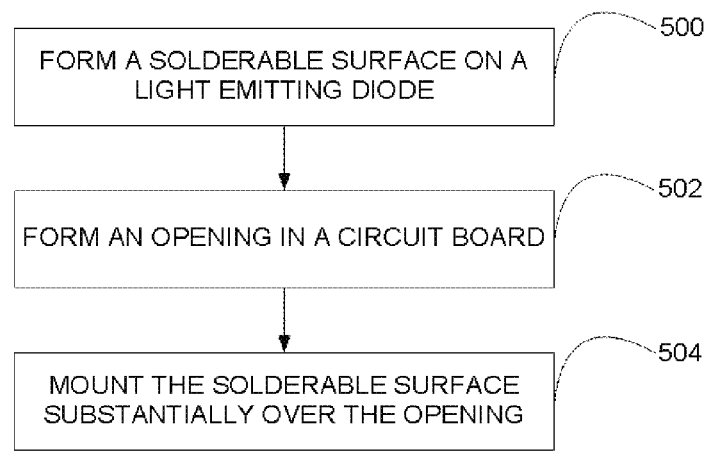
FIG. 5A is a flow chart of an example embodiment of a method for making an electronic assembly.

FIG. 3 illustrates an LED 300 mounted directly on a substrate or circuit board 302. The LED 300 has two electrodes 304 and 306 on a top surface. Electrode 304 is wire bonded to a contact 308 on the substrate or circuit board 302. Electrode 306 is wire bonded to a contact 310 on the substrate or circuit board 302. The substrate or circuit board 302 has a via 314. LED 300 has a solderable surface 312, and the solderable surface is mounted substantially over the via 314 (steps 500, 502, and 504 of FIG. 5A). The substrate or circuit board 302 may contain other circuit elements 316.

The electrodes 304 and 306 are illustrated as being on a top surface of the LED and wire bonded, but the location of the electrodes and how they are connected is not important as long as they are not in the primary path for heat flow. The LED 300 may be contained in a package that may include a reflector, encapsulant, and other housing materials (not illustrated), but it is important to note that the resulting package does not contain an intermediate package substrate or a heat plug. In addition, if the LED 300 is contained in a package, the solderable surface 312 is directly exposed to the outside of the package to enable a metallurgical bond, as discussed further below.

The LED 300, with or without a package, may be mounted on a variety of substrates 302, which may or may not include other components. For example, substrate 302 may be a printed circuit board made from glass epoxy, phenolic, or polyimide. Alternatively, the substrate 302 may be an inorganic material such as ceramic or a semiconductor material such as silicon.

Figure 5B:
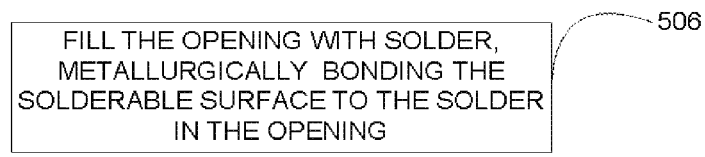
FIG. 5B is a flow chart showing an example additional method step for the method of FIG. 5A.

The LED 300 has a solderable surface 312, separate from the electrodes 304 and 306, that is intended to be directly metallurgically bonded to a heat conducting material in a substrate or circuit board, without an intermediate package substrate. The solderable surface 312 may comprise, for example, a layer of nickel next to the semiconductor surface, and a layer of gold-tin on the outside surface. The via 314 may be filled with solder at the time other components 316 are soldered. Alternatively, the via 314 may be prefilled with a solder paste which is later melted. For either alternative, during assembly of the substrate or circuit board 302, a metallurgical bond is formed between the solderable surface of the LED and the solder in the via(step 506 of FIG. 5B). After soldering, heat flow from LED 300 flows through the solderable surface 312 and then directly into the solder in the via 314. The solder filled via then acts as a heat plug, without requiring an intermediate package substrate or a package that includes a heat plug.

Figure 4:
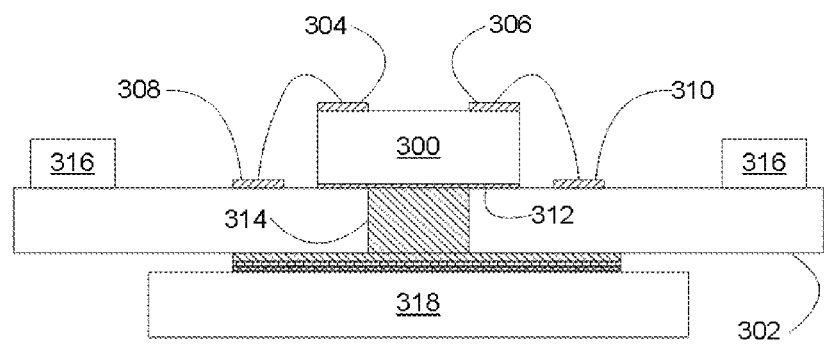
FIG. 4 is a block diagram of the example embodiment of FIG. 3, with additional example heat sinking structure.
Figure 5C:
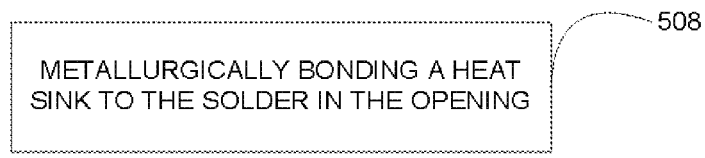
FIG. 5C is a flow chart showing an example additional method step for the method of FIG. 5B.

The substrate or circuit board 302 may contain a metal layer or other structures for heat sinking(step 508 of FIG. 5C). FIG. 4 illustrates an optional heat sink 318 on the surface opposite from the LED 300. Heat sink 318 may be, for example, aluminum. For aluminum, various metal layers may be needed for solderability, and a dielectric layer may be needed for electrical insulation. For example, FIG. 3 illustrates three layers (no reference numbers) which may be, for example, a layer of solder next to the circuit board, a dielectric layer next to the aluminum surface, and a layer of copper between the dielectric layer and the solder. The resulting structure has only two heat transfer interfaces: (1) from the LED body to the solderfilled via, and (2) from the solder-filled via to the substrate or circuit board (or other heat sink). Furthermore, the thermal interfaces are metallurgical or intermetallic, and the thermal conductivity of solder is superior to many other heat conducting materials such as thermal pastes. In addition, solder is commonly used for circuit board assembly, eliminating the need for a separate process step for a heat conducting material.

What is claimed is:

1. An electronic assembly, comprising:
   at least one Light Emitting Diode having an outer periphery and including a first surface with at least two electrodes, the Light Emitting Diode also having a solderable metallic surface on a second surface of the Light Emitting Diode opposite to the first surface such that the solderable metallic surface is only within the outer periphery of the Light Emitting Diode;
   at least one electric circuit element other than the at least one Light Emitting Diode;
   a printed circuit board having a first surface on which the Light Emitting Diode and the at least one electric circuit element are mounted, wherein the printed circuit board has a via; and
   a heat sink disposed on a second surface of the printed circuit board, wherein the second surface is opposed to the first surface,
   wherein the solderable metallic surface is positioned across the via and in direct contact with the printed circuit board and thermally connected to the heat sink through the via to dissipate heat generated by the at least one Light Emitting Diode.

2. The electronic assembly of claim 1, wherein the solderable metallic surface includes a first layer of nickel and a second layer of gold-tin adjacent to the first layer, and wherein the via is filled with solder such that there is a metallurgical bond between the second layer and the solder in the via.

3. A method of making an electronic assembly, comprising:
   forming a solderable metallic surface on a Light Emitting Diode such that the solderable metallic surface is only within an outer periphery of the Light Emitting Diode, the solderable metallic surface being a first surface of the Light Emitting Diode other than a second surface of the Light Emitting Diode having electrodes;
   forming an opening in a printed circuit board;
   mounting the solderable metallic surface across the opening and in direct contact with a first surface of the printed circuit board;
   mounting at least one electric circuit element other than the Light Emitting Diode on the first surface of the printed circuit board; and
   disposing a heat sink on a second surface of the printed circuit board, wherein the second surface is opposed to the first surface,
   wherein the solderable metallic surface is thermally connected to the heat sink through the opening to dissipate heat generated by the Light Emitting Diode.

4. The method of claim 3, further comprising:
   filling the opening with solder; and
   forming a metallurgical bond between the solderable metallic surface and the solder in the opening.

* * * * *